(12) United States Patent
Holmes et al.

(10) Patent No.: US 7,500,228 B2
(45) Date of Patent: Mar. 3, 2009

(54) SYSTEM AND METHOD FOR AUTOMATICALLY GENERATING A HIERARCHICAL REGISTER CONSOLIDATION STRUCTURE

(75) Inventors: Michael A. Holmes, Hillsborough, NJ (US); Gerald S. Williams, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 698 days.

(21) Appl. No.: 10/801,792

(22) Filed: Mar. 16, 2004

(65) Prior Publication Data

US 2005/0015755 A1 Jan. 20, 2005

(51) Int. Cl.
*G06F 9/45* (2006.01)
*G06F 17/50* (2006.01)

(52) U.S. Cl. .............................. 717/136; 716/1; 716/3; 716/8; 703/1

(58) Field of Classification Search ......... 717/101–161; 716/1–8; 703/1
See application file for complete search history.

(56) References Cited

U.S. PATENT DOCUMENTS

| | | | | |
|---|---|---|---|---|
| 5,146,583 A * | 9/1992 | Matsunaka et al. | ............ | 716/3 |
| 5,537,580 A * | 7/1996 | Giomi et al. | ............ | 716/19 |
| 5,541,850 A * | 7/1996 | Vander Zanden et al. | ..... | 716/18 |
| 5,568,644 A * | 10/1996 | Nelson et al. | ............... | 710/268 |
| 5,937,190 A * | 8/1999 | Gregory et al. | ............ | 717/131 |
| 5,995,736 A * | 11/1999 | Aleksic et al. | ................ | 716/18 |
| 6,584,601 B1 * | 6/2003 | Kodosky et al. | ............... | 716/4 |
| 6,609,229 B1 * | 8/2003 | Ly et al. | ......................... | 716/4 |
| 6,631,508 B1 * | 10/2003 | Williams | ........................ | 716/8 |
| 6,760,888 B2 * | 7/2004 | Killian et al. | ................... | 716/1 |
| 6,877,150 B1 * | 4/2005 | Miller et al. | .................. | 716/18 |
| 6,885,983 B1 * | 4/2005 | Ho et al. | ........................ | 703/14 |
| 6,928,629 B2 * | 8/2005 | Johnson | ........................ | 716/4 |
| 7,000,213 B2 * | 2/2006 | Banerjee et al. | ............... | 716/18 |
| 7,024,660 B2 * | 4/2006 | Andrade et al. | ............. | 717/124 |
| 7,080,365 B2 * | 7/2006 | Broughton et al. | .......... | 717/146 |
| 7,085,670 B2 * | 8/2006 | Odom et al. | ................ | 702/127 |
| 7,206,732 B2 * | 4/2007 | Williams et al. | .............. | 703/22 |
| 7,290,244 B2 * | 10/2007 | Peck et al. | ................... | 717/109 |
| 7,389,496 B2 * | 6/2008 | Eckhart et al. | ............. | 717/127 |
| 2002/0162097 A1 * | 10/2002 | Meribout | ..................... | 717/155 |
| 2003/0188302 A1 * | 10/2003 | Chen et al. | .................. | 717/160 |

OTHER PUBLICATIONS

Steve Oualline, Practical C Programming, 3rd Edition, O'Reilly, Aug. 1997.*
Sean M. Burke, Perl & LWP, O'Reilly, Jun. 2002.*

* cited by examiner

*Primary Examiner*—Wei Y Zhen
*Assistant Examiner*—Chih-Ching Chow

(57) ABSTRACT

A system for, and method of, automatically generating a hierarchical register consolidation structure. In one embodiment, the system includes: (1) a graph generator that parses a High-level Design Language (HDL) file to generate an intermediate graph containing definitions of microprocessor-accessible registers, node interrelationships and summary bits and masks associated with alarm registers, (2) a graph converter, associated with the graph generator, that selectively adds virtual elements and nodes to the intermediate graph to transform the intermediate graph into a mathematical tree and (3) a description generator, associated with the graph converter, that employs the mathematical tree to generate a static tree description in a programming language suitable for use by a device-independent condition management structure.

14 Claims, 1 Drawing Sheet

SYSTEM AND METHOD FOR AUTOMATICALLY GENERATING A HIERARCHICAL REGISTER CONSOLIDATION STRUCTURE

CROSS-REFERENCE TO RELATED APPLICATIONS

This application is related to U.S. patent application Ser. No. 10/612,097 entitled "A Condition Management System and Method of Operation Thereof" to Eckhart, et al., filed on Jul. 2, 2003, and U.S. patent application Ser. No. 10/782,080 entitled "A Condition Management Callback System and Method of Operation Thereof" to Hitchcock, et al., filed on Feb. 19, 2004, both of which are commonly assigned with the present invention and incorporated herein by reference as if reproduced herein in their entirety.

TECHNICAL FIELD OF THE INVENTION

The present invention is directed, in general, to processors and, more specifically, to a system and method for automatically generating a hierarchical register consolidation structure.

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

BACKGROUND OF THE INVENTION

Computer systems perform wide-ranging tasks in today's world, to say the least. In performing many of these tasks, computers are called upon to determine the condition of and control external devices. These external devices may be of many different types, including sensors, clocks, actuators, disk drives and motors to name just a few.

A computer typically interacts with external devices by executing a software program that calls for the computer to generate signals that control certain of the devices based on the condition of other of the devices. For example, a computer may adjust the speed of a motor based on the temperature of a fluid that the motor is stirring and the length of time that the motor has been stirring the fluid.

When computers began to be called upon to sense and control external devices, a method called "polling" was developed. Polling calls for the computer actively to query the external devices to determine their condition, usually periodically. In the example above, the computer may poll a thermometer and a clock once a second to determine the fluid temperature and time. While effective for simple tasks involving a relatively small number of devices, polling came to consume ever-greater amounts of the computer's time as the tasks and the numbers of devices became more complex. Polling is inefficient, because the computer must poll even when no conditions requiring the computer's response have occurred. At its extreme, polling may even consume so much time that the computer is precluded from performing other tasks.

To overcome the disadvantages inherent in polling, "interrupts" were developed. With interrupts, the computer does not actively determine the condition of external devices. Instead, changes in device condition ("events") cause signals ("interrupts") to be delivered to the computer, often by way of an "interrupt register," or "alarm register," that contains status information regarding its corresponding external device. The computer is free to execute its software program until it receives an interrupt, at which time it usually departs from its program and responds to, or "handles," the interrupt, often based on the contents of one or more interrupt registers.

Interrupts are widely used today, but they are by no means a perfect solution by themselves. Interrupt handling becomes complex when a computer is called upon to sense and control a great number of external devices, such as may be encountered in a telecommunications or computer network. It becomes more complex when combinations of events trigger different responses by the computer. It becomes still more complex when the events and combinations change depending upon the software instructions that the computer is executing when the events or combinations occur. Combinations of interrupt conditions have become so complex that they are now often organized into a "hierarchical register consolidation structure" to ease their management. Management of the hierarchical register consolidation structure may be performed by a condition management system, or CMS.

Creating a suitable hierarchical register consolidation structure for a system of external devices, however, remains a time-consuming challenge. When a new system is designed, its microprocessor-accessible registers, node interrelationships and summary bits and masks associated with its alarm registers are currently carefully, manually organized into a register consolidation structure that is traversable as a mathematical tree. Systems having many thousands of such registers, interrelationships, summary bits and masks can render the process extremely tedious and exceedingly error-prone. Creating, testing and correcting errors in manually produced hierarchical register consolidation structures takes significant development time and money and can significantly complicate and delay the introduction of new systems. What is needed in the art is a faster, more accurate way to create a hierarchical register consolidation structure.

SUMMARY OF THE INVENTION

To address the above-discussed deficiencies of the prior art, the present invention, in one aspect, provides a system for automatically generating a hierarchical register consolidation structure.

In one embodiment, the system includes: (1) a graph generator that parses a High-level Design Language (HDL) file to generate an intermediate graph containing definitions of microprocessor-accessible registers, node interrelationships and summary bits and masks associated with alarm registers, (2) a graph converter, associated with the graph generator, that selectively adds virtual elements and nodes to the intermediate graph to transform the intermediate graph into a mathematical tree and (3) a description generator, associated with the graph converter, that employs the mathematical tree to generate a static tree description in a programming language suitable for use by a device-independent condition management structure.

In another aspect, the present invention provides a method of automatically generating a hierarchical register consolidation structure. In one embodiment, the method includes: (1) parsing a High-level Design Language (HDL) file to generate an intermediate graph containing definitions of microprocessor-accessible registers, node interrelationships and summary bits and masks associated with alarm registers, (2)

selectively adding virtual elements and nodes to the intermediate graph to transform the intermediate graph into a mathematical tree and (3) employing the mathematical tree to generate a static tree description in a programming language suitable for use by a device-independent condition management structure.

In yet another aspect, the present invention provides a system for automatically generating a hierarchical register consolidation structure. In one embodiment, the system includes: (1) a graph generator that parses a High-level Design Language (HDL) file to generate an intermediate graph containing definitions of microprocessor-accessible registers, node interrelationships and summary bits, bit offsets and masks associated with alarm registers, (2) a graph converter, associated with the graph generator, that selectively adds virtual elements and nodes to the intermediate graph to transform the intermediate graph into a mathematical tree and (3) a description generator, associated with the graph converter, that employs the mathematical tree to generate a static tree description in a programming language suitable for use by a device-independent condition management structure and an HTML traversable tree representation based on the mathematical tree.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
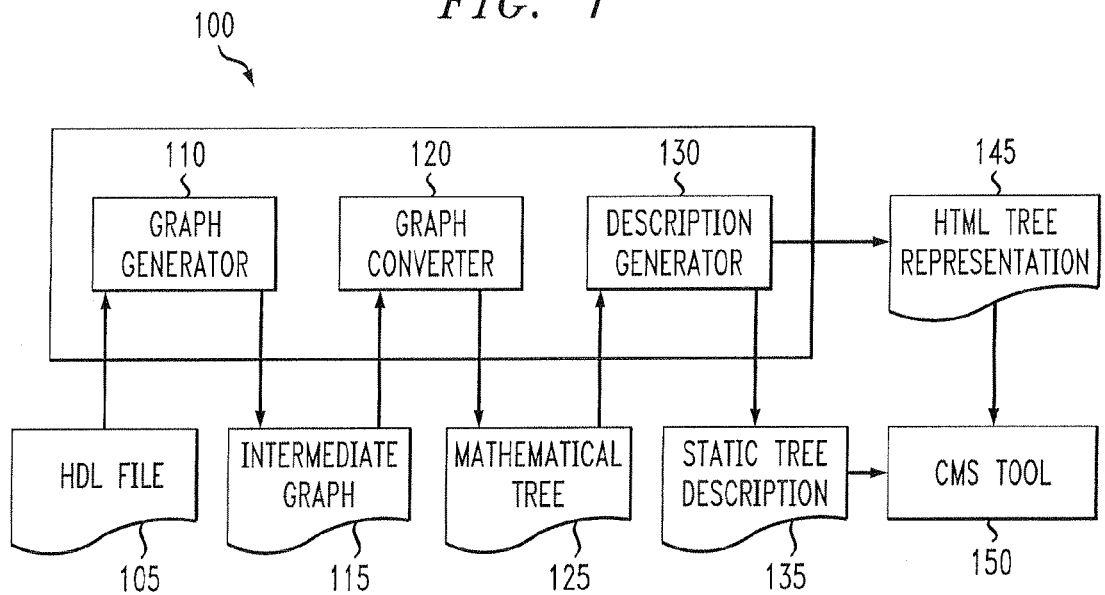
FIG. 1 illustrates a block diagram of a system for automatically generating a hierarchical register consolidation structure constructed according to the principles of the present invention.

Referring initially to FIG. 1, illustrated is a block diagram of a system, generally designated 100, for automatically generating a hierarchical register consolidation structure constructed according to the principles of the present invention.

The system 100 includes a graph generator 110. The graph generator 110 parses a Hardware Description Language (HDL) file 105, which may be a Verilog HDL file. HDL tools and the files they produce are well known to those skilled in the pertinent art. In the illustrated embodiment, the HDL file 105 is produced by a particular hardware description tool called "OTUS." Of course, other HDL file generating tools fall within the broad scope of the present invention. Table 1, below, illustrates an exemplary OTUS microprocessor interface hardware description language file that can be the HDL file 105.

TABLE 1

Exemplary OTUS Microprocessor Interface
Hardware Description Language File

```
// VPP - width of internal data bus (per channel)
// VPP - number of physical channels terminated
// VPP - number of physical channels terminated on Primary Line interface
// VPP - number of data words per column
// VPP - width of data parity bus (design assumes 1 bit per 8 bits data)
// VPP - width of Rx & Tx Line Data Busses
// VPP - sts = 1 to max_num_sts
// VPP - col = 1 to max_num_col
//'let frame_col_size = CEIL (LOG2 ('max_num_col+1))
// VPP - row = 1 to 9
// VPP - number of STS-12s per channel
// VPP - number of STS-12 drop links
// VPP - number of STS-12 add links
// VPP - width of address bus for external processor interface
// VPP - width of data bus for external processor interface
// VPP - width of parity bus for external processor interface
// VPP - width of address bus between MPIF and SPIFs
//*********************************************************************
//*
//* Parameters
//*
//*********************************************************************
'define single_ch 0
'define sonet_mode 0
'define sdh_mode 1
// standard/advanced framing constants
'define enh_frmg 1'b1
'define std_frmg 1'b0
address_bus_width 16;
data_bus_width 16;
//'let ms_addr_bit = 'i_add_width - 1
spif align_spif spif_address_width = 8 [7:0];
```

TABLE 1-continued

Exemplary OTUS Microprocessor Interface
Hardware Description Language File

```
output [10:0] ALIGN_ISR;
////////////////////////////////////////////////////////////////////
//
domain align_common
   clock = CLK,
   reset_signal = RST_N,
   selection = ALIGN_COM_SEL,
   transfer_type = fast;
addr = 8'h00;
//-------------------------------------------------------------------
// INTERRUPT STATUS REGISTER: STS-12 and STS-48 Port Channel Alarms
isreg [10:0] ALIGN_ISR, address = addr,,
   ALIGN_ISR_MASK
{
      0 : ALIGN_CH_W_Q1 {
ALIGN_W_CH_ALARM_1[3:0],
ALIGN_W_CH_ALARM_2[7:4],
ALIGN_W_CH_ALARM_3[11:8],
ALIGN_W_CH_ALARM_4[15:12]},
      1 : ALIGN_CH_W_Q2 {
ALIGN_W_CH_ALARM_5[3:0],
ALIGN_W_CH_ALARM_6[7:4],
ALIGN_W_CH_ALARM_7[11:8],
ALIGN_W_CH_ALARM_8[15:12]},
      2 : ALIGN_CH_W_Q3 {
ALIGN_W_CH_ALARM_9[3:0],
ALIGN_W_CH_ALARM_10[7:4],
ALIGN_W_CH_ALARM_11[11:8],
ALIGN_W_CH_ALARM_12[15:12]},
      3 : ALIGN_CH_W_Q4 {
ALIGN_W_CH_ALARM_13[3:0],
ALIGN_W_CH_ALARM_14[7:4],
ALIGN_W_CH_ALARM_15[11:8],
ALIGN_W_CH_ALARM_16[15:12]},
      4 : ALIGN_CH_P_Q1 {
ALIGN_P_CH_ALARM_1[3:0],
ALIGN_P_CH_ALARM_2[7:4],
ALIGN_P_CH_ALARM_3[11:8],
ALIGN_P_CH_ALARM_4[15:12]},
      5 : ALIGN_CH_P_Q2 {
ALIGN_P_CH_ALARM_5[3:0],
ALIGN_P_CH_ALARM_6[7:4],
ALIGN_P_CH_ALARM_7[11:8],
ALIGN_P_CH_ALARM_8[15:12]},
      6 : ALIGN_CH_P_Q3 {
ALIGN_P_CH_ALARM_9[3:0],
ALIGN_P_CH_ALARM_10[7:4],
ALIGN_P_CH_ALARM_11[11:8],
ALIGN_P_CH_ALARM_12[15:12]},
      7 : ALIGN_CH_P_Q4 {
ALIGN_P_CH_ALARM_13[3:0],
ALIGN_P_CH_ALARM_14[7:4],
ALIGN_P_CH_ALARM_15[11:8],
ALIGN_P_CH_ALARM_16[15:12]},
      8 : ALIGN_CH48_W_1 {
ALIGN_W_CH48_ALARM_1[3:0],
ALIGN_W_CH48_ALARM_2[7:4],
ALIGN_W_CH48_ALARM_3[11:8],
ALIGN_W_CH48_ALARM_4[15:12]},
      9 : ALIGN_CH48_P_1 {
ALIGN_P_CH48_ALARM_1[3:0],
ALIGN_P_CH48_ALARM_2[7:4],
ALIGN_P_CH48_ALARM_3[11:8],
ALIGN_P_CH48_ALARM_4[15:12]},
10 : ALIGN_COMMON { ALIGN_COM_ALARM[1:0] }
      };
bit_description ALIGN_ISR "Alignment Processor Interrupt Status Register"
      ALIGN_CH_W_1[0] "WORK: Alignment Processor STS-12 Quadrant 1 Alarms",
      ALIGN_CH_W_2[1] "WORK: Alignment Processor STS-12 Quadrant 2 Alarms",
      ALIGN_CH_W_3[2] "WORK: Alignment Processor STS-12 Quadrant 3 Alarms",
      ALIGN_CH_W_4[3] "WORK: Alignment Processor STS-12 Quadrant 4 Alarms",
      ALIGN_CH_P_1[4] "PROTECT: Alignment Processor STS-12 Quadrant 1 Alarms",
      ALIGN_CH_P_2[5] "PROTECT: Alignment Processor STS-12 Quadrant 2 Alarms",
      ALIGN_CH_P_3[6] "PROTECT: Alignment Processor STS-12 Quadrant 3 Alarms",
      ALIGN_CH_P_4[7] "PROTECT: Alignment Processor STS-12 Quadrant 4 Alarms",
      ALIGN_CH48_W_1[8] "WORK: Alignment Processor STS-48 Alarms",
```

TABLE 1-continued

Exemplary OTUS Microprocessor Interface
Hardware Description Language File

```
        ALIGN_CH48_P_1[9] "PROTECT: Alignment Processor STS-48 Alarms",
        ALIGN_COMMON[10] "Alignment Processor Common Alarms";
//------------------------------------------------------------------------
// INTERRUPT ENABLE REGISTER: STS-12 and STS-48 Port Channel Alarms Interrupt Enable
iereg [10:0] ALIGN_ISR_MASK, address = addr,,;
bit_description ALIGN_ISR_MASK "Alignment Processor Interrupt Status Mask Register"
        ALIGN_CH_W_M1[0] "WORK: Alignment Processor STS-12 Quadrant 1 Alarms Mask",
        ALIGN_CH_W_M2[1] "WORK: Alignment Processor STS-12 Quadrant 2 Alarms Mask",
        ALIGN_CH_W_M3[2] "WORK: Alignment Processor STS-12 Quadrant 3 Alarms Mask",
        ALIGN_CH_W_M4[3] "WORK: Alignment Processor STS-12 Quadrant 4 Alarms Mask",
        ALIGN_CH_P_M1[4] "PROTECT: Alignment Processor STS-12 Quadrant 1 Alarms Mask",
        ALIGN_CH_P_M2[5] "PROTECT: Alignment Processor STS-12 Quadrant 2 Alarms Mask",
        ALIGN_CH_P_M3[6] "PROTECT: Alignment Processor STS-12 Quadrant 3 Alarms Mask",
        ALIGN_CH_P_M4[7] "PROTECT: Alignment Processor STS-12 Quadrant 4 Alarms Mask",
        ALIGN_CH48_W_M1[8] "WORK: Alignment Processor STS-48 Alarms Mask",
        ALIGN_CH48_P_M1[9] "PROTECT: Alignment Processor STS-48 Alarms Mask",
        ALIGN_COMMON_M[10] "Alignment Processor Common Alarms Mask";
//------------------------------------------------------------------------
// CONTROL REGISTER: Min Threshold for FIFO (Per Quadrant)
group FMIN creg [5:0] FIFO_MIN_1, address = addr, , ;
bit_def FIFO_MIN_1 "FIFO Minimum Threshold Control Register Quadrant %d"
THRESH_Q[5:0]
"THRESH_ERR is triggered if FIFO_DEPTH is less than this value";
clone_rag FIFO_MIN_1, add_to_the_group FMIN, number_of_clones=3 address_offset=8'h01,;
//------------------------------------------------------------------------
// CONTROL REGISTER: Max Threshold for FIFO (Per Quadrant)
group FMAX creg [5:0] FIFO_MAX_1, address = addr, reset_value=6'd63, ;
bit_def FIFO_MAX_1 "FIFO Maximum Threshold Control Register Quadrant %d"
THRESH_Q[5:0]
"THRESH_ERR is triggered if FIFO_DEPTH is greater than this value";
clone_reg FIFO_MAX_1, add_to_the_group FMAX, number_of_clones=3, address_offset=8'h01,;
//------------------------------------------------------------------------
// CONTROL REGISTER: Add Frame Offset
creg [14:0] ADD_FRM_CTRL, address = addr,,;
bit_def ADD_FRM_CTRL "AFRM Offset Control"
DEJ_DIS [14] "AFRM Dejitter Disable control",
OFFSET_COUNT [13:0]
"AFRN Frame Pulse Internal Offset Position
(Mutiples of 78MHz clock cycles)";
//------------------------------------------------------------------------
// CONTROL REGISTER: Resynchronization control
creg [1:0] ALIGN_RESYNC_CTRL ,address = addr,,;
bit_def ALIGN_RESYNC_CTRL "Aligner Resynchronization Control"
RESYNC[0]
"WORK/PROTECT: A 0->1 transition on this bit will force a resync.",
SEF_RESYNC_EN[1]
"WORK/PROTECT: When enabled a resync will be automatically issued if all
the enabled channels go into SEF and at least one recovers.";
//------------------------------------------------------------------------
// CONTROL REGISTER: Spare Register
creg [15:0] ALIGN_SPARE_REG ,address = addr,,;
bit_description ALIGN_SPARE_REG "Align Processor Spare Register"
ALIGN_SPARE_REG[15:0] "Reserved Use";
//------------------------------------------------------------------------
// ALARM REGISTER: Common Alarms
iareg [1:0] ALIGN_COM_ALARM, address = addr,,
    ALIGN_COM_MASK;
bit_def ALIGN_COM_ALARM "Align Common Alarms"
    AFRM_LOF      [0] "AFRM Loss of Frame",
    AFRM_RESYNC [1] "AFRM Re-synchronization Alarm";
iereg [1:0] ALIGN_COM_MASK, address = addr,,;
bit_description ALIGN_COM_MASK "Align Common Interrupt Alarm Mask Register"
    AFRM_LOF_M      [0] "AFRM Lass of Frame Mask",
    AFRM_RESYNC_M [1] "AFRM Re-synchronization Alarm Mask";
enddomain
////////////////////////////////////////////////////////////
// WORK: CHANNELS ALIGNER REGISTERS
domain align_w_ch
   clock = W_CLK,
   reset_signal = W_RST_N,
   selection = ALIGN_W_CH_SEL,
   transfer_type = fast;
addr = 8'h00;
//------------------------------------------------------------------------
// INTERRUPT ALARM REGISTER: Working Channel Alarms
iareg [3:0] ALIGN_W_CH_ALARM_1, address = addr,,ALIGN_W_CH_MASK_1;
```

TABLE 1-continued

Exemplary OTUS Microprocessor Interface
Hardware Description Language File

```
bit_def ALIGN_W_CH_ALARM_1 "WORK: Alignment Processor STS-12 Channels 1 to 4 Interrupt Alarm Register"
    SYNC_LIMIT_ERR[0]        "WORK: The Channels to be Synced are too far apart"
    ALIGN_ERR[1]             "WORK: The Frame Pulses from Synced Channels don't match",
    FIFO_WINDOW_ERR[2]       "WORK: This Channel Cannot be Aligned using the Current FIFO Window",
    THRESH_ERR[3]            "WORK: The Depth of this Channel is >FIFO_MAX or <FIFO_MIN";
ireg [3:0] ALIGN_W_CH_MASK_1, address = addr,,;
bit_description ALIGN_W_CH_MASK_1 "WORK: Alignment Processor STS-12 Channels 1 to 4 Interrupt Alarm Mask Register"
    SYNC_LIMIT_ERR[0]        "WORK: The Channels to be Synced are too far apart Mask",
    ALIGN_ERR[1]             "WORK: The Frame Pulses from Synced Channels don't match Mask",
    FIFO_WINDOW_ERR[2]       "WORK: This Channel Cannot be Aligned using the Current FIFO Window Mask",
    THRESH_ERR[3]            "WORK: The Depth of this Channel is >FIFO_MAX or <FIFO_MIN Mask";
addr - = 2;
iareg [7:4] ALIGN_W_CH_ALARM_2, address = addr, ,ALIGN_W_CH_MASK_2;
bit_def ALIGN_W_CH_ALARM_2 "WORK: Alignment Processor STS-12 Channels 2 to 5 Interrupt Alarm Register"
    SYNC_LIMIT_ERR[4]        "WORK: The Channels to be Synced are too far apart",
    ALIGN_ERR[5]             "WORK: The Frame Pulses from Synced Channels don't match",
    FIFO_WINDOW_ERR[6]       "WORK: This Channel Cannot be Aligned using the Current FIFO Window",
    THRESH_ERR[7]            "WORK: The Depth of this Channel is >FIFO_MAX or <FIFO_MIN";
ireg [7:4] ALIGN_W_CH_MASK_2, address = addr,,;
bit_description ALIGN_W_CH_MASK_2 "WORK: Alignment Processor STS-12 Channels 2 to 5 Interrupt Alarm Mask Register"
    SYNC_LIMIT_ERR[4]        "WORK: The Channels to be Synced are too far apart Mask",
    ALIGN_ERR[5]             "WORK: The Frame Pulses from Synced Channels don't match Mask",
    FIFO_WINDOW_ERR[6]       "WORK: This Channel Cannot be Aligned using the Current FIFO Window Mask",
    THRESH_ERR[7]            "WORK: The Depth of this Channel is >FIFO_MAX or <FIFO_MIN Mask";
addr - = 2;
iareg [11:8] ALIGN_W_CH_ALARM_3, address = addr,,ALIGN_W_CH_MASK_3;
bit_def ALIGN_W_CH_ALARM_3 "WORK: Alignment Processor STS-12 Channels 3 to 6 Interrupt Alarm Register"
    SYNC_LIMIT_ERR[8]        "WORK: The Channels to be Synced are too far apart",
    ALIGN_ERR[9]             "WORK: The Frame Pulses from Synced Channels don't match",
    FIFO_WINDOW_ERR[10]      "WORK: This Channel Cannot be Aligned using the Current FIFO Window",
    THRESH_ERR[11]           "WORK: The Depth of this Channel is >FIFO_MAX or <FIFO_MIN";
ireg [11:8] ALIGN_W_CH_MASK_3, address = addr,,;
bit_description ALIGN_W_CH_MASK_3 "WORK: Alignment Processor STS-12 Channels 3 to 6 Interrupt Alarm Mask Register"
    SYNC_LIMIT ERR[8]        "WORK: The Channels to be Synced are too far apart Mask",
    ALIGN_ERR[9]             "WORK: The Frame Pulses from Synced Channels don't match Mask",
    FIFO_WINDOW_ERR[10]      "WORK: This Channel Cannot be Aligned using the Current FIFO Window Mask",
    THRESH_ERR[11]           "WORK: The Depth of this Channel is >FIFO_MAX or <FIFO_MIN Mask";
addr - = 2;
iareg [15:12] ALIGN_W_CH_ALARM_4, address = addr, ,ALIGN_W_CH_MASK_4;
bit_def ALIGN_W_CH_ALARM_4, "WORK: Alignment Processor STS-12 Channels 4 to 7 Interrupt Alarm Register"
    SYNC_LIMIT_ERR[12]       "WORK: The Channels to be Synced are too far apart",
    ALIGN_ERR[13]            "WORK: The Frame Pulses from Synced Channels don't match",
    FIFO_WINDOW_ERR[14]      "WORK: This Channel Cannot be Aligned using the Current FIFO Window",
    THRESH_ERR[15]           "WORK: The Depth of this Channel is >FIFO_MAX or <FIFO_MIN";
ireg [15:12] ALIGN_W_CH_MASK_4, address = addr,,;
bit_description ALIGN_W_CH_MASK_4 "WORK: Alignment Processor STS-12 Channels 4 to 7 Interrupt Alarm Mask Register"
    SYNC_LIMIT_ERR[12]       "WORK: The Channels to be Synced are too far apart Mask",
    ALIGN_ERR[13]            "WORK: The Frame Pulses from Synced Channels don't match Mask",
    FIFO_WINDOW_ERR[14]      "WORK: This Channel Cannot be Aligned using the Current FIFO Window Mask",
    THRESH_ERR[15]           "WORK: The Depth of this Channel is >FIFO_MAX or <FIFO_MIN Mask";
//---------------------------------------------------------------------
// INTERRUPT ALARM REGISTER: Working Channel Alarms
iareg [3:0] ALIGN_W_CH_ALARM_5, address = addr,,ALIGN_W_CH_MASK_5;
bit_def ALIGN_W_CH_ALARM_5 "WORK: Alignment Processor STS-12 Channels 5 to 8 Interrupt Alarm Register"
    SYNC_LIMIT_ERR [0]       "WORK: The Channels to be Synced are too far apart",
    ALIGN_ERR[1]             "WORK: The Frame Pulses from Synced Channels don't match",
    FIFO_WINDOW_ERR[2]       "WORK: This Channel Cannot be Aligned using the Current FIFO Window",
    THRESH_ERR[3]            "WORK: The Depth of this Channel is >FIFO_MAX or <FIFO_MIN";
ireg [3:0] ALIGN_W_CH_MASK_5, address = addr,,;
bit_description ALIGN_W_CH_MASK_5 "WORK: Alignment Processor STS-12 Channels 5 to 8 Interrupt Alarm Mask Register"
    SYNC_LIMIT_ERR[0]        "WORK: The Channels to be Synced are too far apart Mask",
    ALIGN_ERR[1]             "WORK: The Frame Pulses from Synced Channels don't match Mask",
    FIFO_WINDOW_ERR[2]       "WORK: This Channel Cannot be Aligned using the Current FIFO Window Mask",
    THRESH_ERR [3]           "WORK: The Depth of this Channel is >FIFO_MAX or <FIFO_MIN Mask";
addr - = 2;
iareg [7:4] ALIGN_W_CH_ALARM_6, address = addr, ,ALIGN_W_CH_MASK_6;
bit_def ALIGN_W_CH_ALARM_6 "WORK: Alignment Processor STS-12 Channels 6 to 9 Interrupt Alarm Register"
    SYNC_LIMIT_ERR [4]       "WORK: The Channels to be Synced are too far apart",
    ALIGN_ERR[5]             "WORK: The Frame Pulses from Synced Channels don't match",
    FIFO_WINDOW_ERR(6)       "WORK: This Channel Cannot be Aligned using the Current FIFO Window",
    THRESH_ERR [7]           "WORK: The Depth of this Channel is >FIFO_MAX or <FIFO_MIN";
ireg [7:4] ALIGN_W_CH_MASK_6, address = addr,,;
bit_description ALIGN_W_CH_MASK_6 "WORK: Alignment Processor STS-12 Channels 6 to 9 Interrupt Alarm Mask Register"
    SYNC_LIMIT_ERR[4]        "WORK: The Channels to be Synced are too far apart Mask",
    ALIGN_ERR[5]             "WORK: The Frame Pulses from Synced Channels don't match Mask",
    FIFO_WINDOW_ERR[6]       "WORK: This Channel Cannot be Aligned using the Current FIFO Window Mask",
```

TABLE 1-continued

Exemplary OTUS Microprocessor Interface
Hardware Description Language File

```
    THRESH_ERR [7]              "WORK: The Depth of this Channel is >FIFO_MAX or <FIFO_MIN Mask";
addr - = 2;
iareg [11:8] ALIGN_W_CH_ALARM_7, address = addr, ,ALIGN_W_CH_MASK_7;
bit_def ALIGN_W_CH_ALARM_7 "WORK: Alignment Processor STS-12 Channels 7 to 10 Interrupt Alarm Register"
    SYNC_LIMIT_ERR[8]          "WORK: The Channels to be Synced are too far apart",
    ALIGN_ERR[9]               "WORK: The Frame Pulses from Synced Channels don't match",
    FIFO_WINDOW_ERR[10]        "WORK: This Channel Cannot be Aligned using the Current FIFO Window",
    THRESH_ERR[11]             "WORK: The Depth of this Channel is >FIFO_MAX or <FIFO_MIN";
iareg [11:8] ALIGN_W_CH_MASK_7, address = addr,,;
bit_description ALIGN_W_CH_MASK_7 "WORK: Alignment Processor STS-12 Channels 7 to 10 Interrupt Alarm Mask Register"
    SYNC_LIMIT_ERR[8]          "WORK: The Channels to be Synced are too far apart Mask",
    ALIGN_ERR[9]               "WORK: The Frame Pulses from Synced Channels don't match Mask",
    FIFO_WINDOW_ERR[10]        "WORK: This Channel Cannot be Aligned using the Current FIFO Window Mask",
    THRESH_ERR[11]             "WORK: The Depth of this Channel is >FIFO_MAX or <FIFO_MIN Mask";
addr - = 2;
iareg [15:12] ALIGN_W_CH_ALARM_8, address = addr,,ALIGN_W_CH_MASK_8;
bit_def ALIGN_W_CH_ALARM_8 "WORK: Alignment Processor STS-12 Channels 8 to 11 Interrupt Alarm Register"
    SYNC_LIMIT_ERR[12]         "WORK: The Channels to be Synced are too far apart",
    ALIGN_ERR[13]              "WORK: The Frame Pulses from Synced Channels don't match",
    FIFO_WINDOW_ERR[14]        "WORK: This Channel Cannot be Aligned using the Current FIFO Window",
    THRESH_ERR[15]             "WORK: The Depth of this Channel is >FIFO_MAX or <FIFO_MIN";
iareg [15:12] ALIGN_W_CH_MASK_8, address = addr,,;
bit_description ALIGN_W_CH_MASK_8 "WORK: Alignment Processor STS-12 Channels 8 to 11 Interrupt Alarm Mask Register"
    SYNC_LIMIT_ERR[12]         "WORK: The Channels to be Synced are too far apart Mask",
    ALIGN_ERR[13]              "WORK: The Frame Pulses from Synced Channels don't match Mask",
    FIFO_WINDOW_ERR[14]        "WORK: This Channel Cannot be Aligned using the Current FIFO Window Mask",
    THRESH_ERR[15]             "WORK: The Depth of this Channel is >FIFO_MAX or <FIFO_MIN Mask";
//-----------------------------------------------------------------------
// INTERRUPT ALARM REGISTER: Working Channel Alarms
iareg [3:0] ALIGN_W_CH_ALARM_9, address = addr,,ALIGN_W_CH_MASK_9;
bit_def ALIGN_W_CH_ALARM_9 "WORK: Alignment Processor STS-12 Channels 9 to 12 Interrupt Alarm Register"
    SYNC_LIMIT_ERR[0]          "WORK: The Channels to be Synced are too far apart",
    ALIGN_ERR[1]               "WORK: The Frame Pulses from Synced Channels don't match",
    FIFO_WINDOW_ERR[2]         "WORK: This Channel Cannot be Aligned using the Current FIFO Window",
    THRESH_ERR[3]              "WORK: The Depth of this Channel is >FIFO_MAX or <FIFO_MIN";
iareg [3:0] ALIGN_W_CH_MASK_9, address = addr,,;
bit_description ALIGN_W_CH_MASK_9 "WORK: Alignment Processor STS-12 Channels 9 to 12 Interrupt Alarm Mask Register"
    SYNC_LIMIT_ERR[0]          "WORK: The Channels to be Synced are too far apart Mask",
    ALIGN_ERR[1]               "WORK: The Frame Pulses from Synced Channels don't match Mask",
    FIFO_WINDOW_ERR[2]         "WORK: This Channel Cannot be Aligned using the Current FIFO Window Mask",
    THRESH_ERR[3]              "WORK: The Depth of this Channel is >FIFO_MAX or <FIFO_MIN Mask";
addr - = 2;
iareg [7:4] ALIGN_W_CH_ALARM_10, address = addr,,ALIGN_W_CH_MASK_10;
bit_def ALIGN_W_CH_ALARM_10, "WORK: Alignment Processor STS-12 Channels 10 to 13 Interrupt Alarm Register"
    SYNC_LIMIT_ERR[4]          "WORK: The Channels to be Synced are too far apart",
    ALIGN_ERR[5]               "WORK: The Frame Pulses from Synced Channels don't match",
    FIFO_WINDOW_ERR[6]         "WORK: This Channel Cannot be Aligned using the Current FIFO Window",
    THRESH_ERR[7]              "WORK: The Depth of this Channel is >FIFO_MAX or <FIFO_MIN";
```

The graph generator 110 generates an intermediate graph 115 from the HDL file 105. In the illustrated embodiment, the graph generator 110 generates the intermediate graph 115 by making three passes through the HDL file 105. In a first pass, the graph generator 110 extracts the definitions of all the microprocessor-accessible registers, register names, addresses, bit positions used and their names. In a second pass, the graph generator 110 identifies node interrelationships and associates alarm registers with their mask register and persistency and delta information. In a third and final pass, the graph generator 110 associates summary bits in an alarm register with the alarm register that is summarized and generates bit offsets and masks are generated. The intermediate graph 115 that results after these three passes therefore contains definitions of microprocessor-accessible registers, node interrelationships and summary bits and masks associated with alarm registers of the system of external devices to which the HDL file pertains. In the illustrated embodiment, the intermediate graph 115 further contains bit offsets associated with the alarm registers.

The system 100 further includes a graph converter 120. The graph converter 120 is associated with the graph generator 110 and receives the intermediate graph 115 therefrom. The graph converter 120 removes elements of the hardware interrupt tree that cause it to be a graph rather than a true mathematical tree. To do so, the graph converter 120 iterates over the intermediate graph identifying and creating virtual elements and virtual nodes that map to the same physical address. The graph converter 120 removes multiple parent situations and optionally modifies or prunes the intermediate graph 115 if sections of the system are not being used in a particular application. Pruning reduces the size of the resulting mathematical tree 125 and makes it faster to traverse. The resulting tree 125 is a true mathematical tree and can be used with a condition management system, or CMS, tool.

The system 100 further includes a description generator 130. The description generator 130 is associated with the graph converter 120. The description generator 130 employs the mathematical tree 125 to generate a static tree description 135 in a programming language suitable for use by a device-independent CMS. In the illustrated embodiment, that programming language is C, though other programming languages fall within the broad scope of the present invention. Tables 2 and 3, below, illustrate exemplary static tree descriptions in C for both output nodes (Table 2) and output elements (Table 3).

TABLE 2

Static Tree Description in C:
Output Node Descriptions

```
static Node defaultTreeNode[ ] = {
{CHIP_SPIF_SEL_CHIP_STATUS_BIT_0,
    CHIP_SPIF_SEL_CHIP_ISR_1_BIT_0, 16, 0x0000, 0x0001,
    NON_EXISTENT, NON_EXISTENT, INT_CHIP_
    SPIF_SEL_CHIP_ISR_1},
{CHIP_SPIF_SEL_CHIP_STATUS_BIT_0_V0,
    CHIP_SPIF_SEL_CHIP_ISR_2_BIT_0, 25, 0x0002, 0x0003,
    NON_EXISTENT, NON_EXISTENT, INT_CHIP_SPIF_
    SEL_CHIP_ISR_2},
{invalidElem, CHIP_SPIF_SEL_CHIP_STATUS_BIT_0, 2, 0x0014,
    NON_EXISTENT, NON_EXISTENT, NON_EXISTENT,
    INT_CHIP_SPIF_SEL_CHIP_STATUS},
{CHIP_SPIF_SEL_CHIP_ISR_2_BIT_3,
    CHIP_SPIF_SEL_OH_CLK_LOSS_
    ALARM_ERTOH_CLK_FAIL, 8,
    NON_EXISTENT, 0x001E, NON_EXISTENT, 0x001D,
    INT_CHIP_SPIF_SEL_OH_CLK_LOSS_ALARM},
{CHIP_SPIF_SEL_CHIP_ISR_2_BIT_13_V4,
    CHIP_SPIF_SEL_RDMX_RESYNC_BIT_0, 16, NON_
    EXISTENT, 0x0021,
    NON_EXISTENT, 0x0020, INT_CHIP_SPIF_SEL_RDMX_
    RESYNC},
{CHIP_SPIF_SEL_CHIP_ISR_2_BIT_13_V3,
    CHIP_SPIF_SEL_RMUX_TDMX_RESYNC_BIT_
    0, 8, NON_EXISTENT,
    0x0025, NON_EXISTENT, 0x0024,
    INT_CHIP_SPIF_SEL_RMUX_TDMX_RESYNC},
{CHIP_SPIF_SEL_CHIP_ISR_2_BIT_0,
    CHIP_SPIF_SEL_R_CLK_LOSS_ALARM_
    R_CLK_1_FAIL, 16,
    NON_EXISTENT, 0x0018, NON_EXISTENT, 0x0017,
    INT_CHIP_SPIF_SEL_R_CLK_LOSS_ALARM},
{CHIP_SPIF_SEL_CHIP_ISR_2_BIT_2,
    CHIP_SPIF_SEL_S_CLK_LOSS_ALARM_
    D_CLK_1_FAIL, 10,
    NON_EXISTENT, 0x001C, NON_EXISTENT, 0x001B,
    INT_CHIP_SPIF_SEL_S_CLK_LOSS_ALARM},
{CHIP_SPIF_SEL_CHIP_ISR_2_BIT_4,
    CHIP_SPIF_SEL_S_CLK_LOSS_ALARM_
    PM_CLK, 1, NON_EXISTENT,
    0x001C, NON_EXISTENT, 0x001B,
    INT_CHIP_SPIF_SEL_S_CLK_LOSS_ALARM_V0},
{CHIP_SPIF_SEL_CHIP_ISR_2_BIT_14_V6,
    CHIP_SPIF_SEL_S_RDMX_RESYNC_BIT_0, 16,
    NON_EXISTENT,
    0x0027, NON_EXISTENT, 0x0026,
    INT_CHIP_SPIF_SEL_S_RDMX_RESYNC},
{CHIP_SPIF_SEL_CHIP_ISR_2_BIT_14_V5,
    CHIP_SPIF_SEL_S_RMUX_TDMX_RESYNC_BIT_
    0, 8, NON_EXISTENT,
    0x002B, NON_EXISTENT, 0x002A,
    INT_CHIP_SPIF_SEL_S_RMUX_TDMX_RESYNC},
{CHIP_SPIF_SEL_CHIP_ISR_2_BIT_14,
    CHIP_SPIF_SEL_S_TMUX_RESYNC_BIT_0, 16,
    NON_EXISTENT,
    0x0029, NON_EXISTENT, 0x0028,
    INT_CHIP_SPIF_SEL_S_TMUX_RESYNC},
{CHIP_SPIF_SEL_CHIP_ISR_2_BIT_8, CHIP_
    SPIF_SEL_TIMED_INT_BIT_0,
    1, NON_EXISTENT, 0x0016, NON_EXISTENT, 0x0015,
    INT_CHIP_SPIF_SEL_TIMED_INT},
{CHIP_SPIF_SEL_CHIP_ISR_2_BIT_13,
    CHIP_SPIF_SEL_TMUX_RESYNC_BIT_0, 16, NON_
    EXISTENT, 0x0023,
    NON_EXISTENT, 0x0022, INT_CHIP_SPIF_SEL_TMUX_
    RESYNC},
{CHIP_SPIF_SEL_CHIP_ISR_2_BIT_1,
    CHIP_SPIF_SEL_T_CLK_LOSS_ALARM_
    T_CLK_1_FAIL, 16,
```

TABLE 2-continued

Static Tree Description in C:
Output Node Descriptions

```
    NON_EXISTENT, 0x001A, NON_EXISTENT, 0x0019,
    INT_CHIP_SPIF_SEL_T_CLK_LOSS_ALARM},
{EQPT_COMMON_SEL_EQPT_ISR_BIT_0,
    EQPT_ADD_SEL_1_EQPT_TX_CH_ISR_
    BIT_0, 2, 0x7701, 0x7702,
    NON_EXISTENT, NON_EXISTENT,
    INT_EQPT_ADD_SEL_1_EQPT_TX_CH_ISR},
{EQPT_COMMON_SEL_EQPT_ISR_V0_BIT_0,
    EQPT_ADD_SEL_1_EQPT_TX_CH_ISR_
    V0_BIT_0, 14, 0x7701,
    0x7702, NON_EXISTENT, NON_EXISTENT}
}
```

TABLE 3

Static Tree Description in C:
Output Element Descriptions

```
static Elem defaultTreeElement[ ] = {
{INT_RX_LTE_SPIF_COMMON_SEL_LTE_ISR_1,
    INT_CHIP_SPIF_SEL_CHIP_ISR_1, 0,
    CHIP_SPIF_SEL_CHIP_ISR_1_BIT_0},
{INT_RX_LTE_SPIF_COMMON_SEL_LTE_ISR_1_V0,
    INT_CHIP_SPIF_SEL_CHIP_ISR_1, 1,
    CHIP_SPIF_SEL_CHIP_ISR_1_BIT_1},
{INT_RX_LTE_SPIF_COMMON_SEL_LTE_ISR_2,
    INT_CHIP_SPIF_SEL_CHIP_ISR_1, 2,
    CHIP_SPIF_SEL_CHIP_ISR_1_BIT_2},
{INT_RX_LTE_SPIF_COMMON_SEL_LTE_ISR_2_V0,
    INT_CHIP_SPIF_SEL_CHIP_ISR_1, 3,
    CHIP_SPIF_SEL_CHIP_ISR_1_BIT_3},
{INT_RX_LTE_SPIF_COMMON_SEL_LTE_ISR_3,
    INT_CHIP_SPIF_SEL_CHIP_ISR_1, 4,
    CHIP_SPIF_SEL_CHIP_ISR_1_BIT_4},
{INT_RX_LTE_SPIF_COMMON_SEL_LTE_ISR_3_V0,
    INT_CHIP_SPIF_SEL_CHIP_ISR_1, 5,
    CHIP_SPIF_SEL_CHIP_ISR_1_BIT_5},
{INT_RX_LTE_SPIF_COMMON_SEL_LTE_ISR_4,
    INT_CHIP_SPIF_SEL_CHIP_ISR_1, 6,
    CHIP_SPIF_SEL_CHIP_ISR_1_BIT_6},
{INT_RX_LTE_SPIF_COMMON_SEL_LTE_ISR_4_V0,
    INT_CHIP_SPIF_SEL_CHIP_ISR_1, 7,
    CHIP_SPIF_SEL_CHIP_ISR_1_BIT_7},
{INT_TX_LTE_SPIF_COMMON_SEL_LTE_ISR_1,
    INT_CHIP_SPIF_SEL_CHIP_ISR_1, 8,
    CHIP_SPIF_SEL_CHIP_ISR_1_BIT_8},
{INT_TX_LTE_SPIF_COMMON_SEL_LTE_ISR_1_V0,
    INT_CHIP_SPIF_SEL_CHIP_ISR_1, 9,
    CHIP_SPIF_SEL_CHIP_ISR_1_BIT_9},
{INT_RX_MEGA_POH_SEL_STS192_CH_ISR,
    INT_CHIP_SPIF_SEL_CHIP_ISR_1, 10,
    CHIP_SPIF_SEL_CHIP_ISR_1_BIT_10},
{INT_RX_MEGA_POH_SEL_STS192_CH_ISR_V0,
    INT_CHIP_SPIF_SEL_CHIP_ISR_1, 11,
    CHIP_SPIF_SEL_CHIP_ISR_1_BIT_11},
{INT_TX_MEGA_POH_SEL_STS192_CH_ISR,
    INT_CHIP_SPIF_SEL_CHIP_ISR_1, 12,
    CHIP_SPIF_SEL_CHIP_ISR_1_BIT_12},
{INT_TX_MEGA_POH_SEL_STS192_CH_ISR_V0,
    INT_CHIP_SPIF_SEL_CHIP_ISR_1, 13,
    CHIP_SPIF_SEL_CHIP_ISR_1_BIT_13},
{INT_EQPT_COMMON_SEL_EQPT_ISR,
    INT_CHIP_SPIF_SEL_CHIP_ISR_1, 14,
    CHIP_SPIF_SEL_CHIP_ISR_1_BIT_14},
{INT_EQPT_COMMON_SEL_EQPT_ISR_V1,
    INT_CHIP_SPIF_SEL_CHIP_ISR_1, 15,
    CHIP_SPIF_SEL_CHIP_ISR_1_BIT_15},
{INT_CHIP_SPIF_SEL_R_CLK_LOSS_ALARM,
    INT_CHIP_SPIF_SEL_CHIP_ISR_2, 0,
    CHIP_SPIF_SEL_CHIP_ISR_2_BIT_0},
{INT_CHIP_SPIF_SEL_T_CLK_LOSS_ALARM,
    INT_CHIP_SPIF_SEL_CHIP_ISR_2, 1,
    CHIP_SPIF_SEL_CHIP_ISR_2_BIT_1},
```

TABLE 3-continued

Static Tree Description in C:
Output Element Descriptions

```
    {INT_CHIP_SPIF_SEL_S_CLK_LOSS_ALARM,
        INT_CHIP_SPIF_SEL_CHIP_ISR_2, 2,
        CHIP_SPIF_SEL_CHIP_ISR_2_BIT_2},
    {INT_CHIP_SPIF_SEL_OH_CLK_LOSS_ALARM,
        INT_CHIP_SPIF_SEL_CHIP_ISR_2, 3,
        CHIP_SPIF_SEL_CHIP_ISR_2_BIT_3},
    {INT_CHIP_SPIF_SEL_S_CLK_LOSS_ALARM_V0,
        INT_CHIP_SPIF_SEL_CHIP_ISR_2, 4,
        CHIP_SPIF_SEL_CHIP_ISR_2_BIT_4},
    {INT_RX_MEGA_SWITCH_SEL_MEGA_SWITCH_INT,
        INT_CHIP_SPIF_SEL_CHIP_ISR_2, 5,
        CHIP_SPIF_SEL_CHIP_ISR_2_BIT_5},
    {INT_TX_MEGA_SWITCH_SEL_MEGA_SWITCH_INT,
        INT_CHIP_SPIF_SEL_CHIP_ISR_2, 6,
        CHIP_SPIF_SEL_CHIP_ISR_2_BIT_6},
    {INT_EQPT_COMMON_SEL_EQPT_ISR_V0,
        INT_CHIP_SPIF_SEL_CHIP_ISR_2, 7,
        CHIP_SPIF_SEL_CHIP_ISR_2_BIT_7},
    {INT_CHIP_SPIF_SEL_TIMED_INT,
        INT_CHIP_SPIF_SEL_CHIP_ISR_2, 8,
        CHIP_SPIF_SEL_CHIP_ISR_2_BIT_8},
    {INT_LTE_RX_TRANS_SEL_1_TRANS_MEM_ISR,
        INT_CHIP_SPIF_SEL_CHIP_ISR_2, 9,
        CHIP_SPIF_SEL_CHIP_ISR_2_BIT_9},
    {INT_LTE_TX_TRANS_SEL_1_TRANS_MEM_ISR,
        INT_CHIP_SPIF_SEL_CHIP_ISR_2, 10,
        CHIP_SPIF_SEL_CHIP_ISR_2_BIT_10},
    {INT_RX_SERDES_SPIF_SEL_HCCRX_ISR,
        INT_CHIP_SPIF_SEL_CHIP_ISR_2, 11,
        CHIP_SPIF_SEL_CHIP_ISR_2_BIT_11},
    {INT_TX_SERDES_SPIF_SEL_HCCTX_ISR,
        INT_CHIP_SPIF_SEL_CHIP_ISR_2, 12,
        CHIP_SPIF_SEL_CHIP_ISR_2_BIT_12},
    {INT_CHIP_SPIF_SEL_TMUX_RESYNC,
        INT_CHIP_SPIF_SEL_CHIP_ISR_2, 13,
        CHIP_SPIF_SEL_CHIP_ISR_2_BIT_13},
    {INT_CHIP_SPIF_SEL_S_TMUX_RESYNC,
        INT_CHIP_SPIF_SEL_CHIP_ISR_2, 14,
        CHIP_SPIF_SEL_CHIP_ISR_2_BIT_14},
    {INT_LTE_TX_TRANS_SEL_2_TRANS_MEM_ISR,
        INT_CHIP_SPIF_SEL_CHIP_ISR_2, 10,
        CHIP_SPIF_SEL_CHIP_ISR_2_BIT_10_V0}
}
```

In the illustrated embodiment, the description generator 130 further generates a HyperText Markup Language (HTML) traversable tree representation 145 based on the mathematical tree 125. The static tree description 135 and/or the HTML traversable tree representation 145 form a hierarchical register consolidation structure. Tables 4, 5 and 6, below, illustrate exemplary HTML traversable tree representations for address 0x0, mask=0xffff (Table 4); address=0x2, mask=0x7fff (Table 5); and address=0x14, mask=0x7fff (Table 6). In Tables 4, 5 and 6, underlined numerals represent HTML hyperlinks.

TABLE 4

HTML Traversable Tree Representation:
CHIP_SPIF_SEL_CHIP_ISR_1, Address = 0x0, Mask = 0xffff

| Bit position<br>Bit name | Direction<br>Register name: contributing bit 1, contributing bit N |
|---|---|
| Consolidation 0 | UP LINKS |
| CHIP_SPIF_ | CHIP_SPIF_SEL_CHIP_STATUS: 0 |
| SEL_CHIP_ | DOWN LINKS |
| ISR_1_BIT_0 | RX_LTE_SPIF_COMMON_SEL_LTE_ISR_ |
| REAL bit 0 | 1: 0, 1, 2, 3, 8 |
| Consolidation 1 | UP LINKS |
| CHIP_SPIF_ | CHIP_SPIF_SEL_CHIP_STATUS: 0 |

TABLE 4-continued

HTML Traversable Tree Representation:
CHIP_SPIF_SEL_CHIP_ISR_1, Address = 0x0, Mask = 0xffff

| Bit position<br>Bit name | Direction<br>Register name: contributing bit 1, contributing bit N |
|---|---|
| SEL_CHIP_ | DOWN LINKS |
| ISR_1_BIT_1 | RX_LTE_SPIF_COMMON_SEL_LTE_ISR_ |
| REAL bit 1 | 1_V0: 0, 1, 2, 3, 4, 5, 6, 7, 8 |
| Consolidation 2 | UP LINKS |
| CHIP_SPIF_ | CHIP_SPIF_SEL_CHIP_STATUS: 0 |
| SEL_CHIP_ | DOWN LINKS |
| ISR_1_BIT_2 | RX_LTE_SPIF_COMMON_SEL_LTE_ISR_ |
| REAL bit 2 | 2: 0, 1, 2, 3, 8 |
| Consolidation 3 | UP LINKS |
| CHIP_SPIF_ | CHIP_SPIF_SEL_CHIP_STATUS: 0 |
| SEL_CHIP_ | DOWN LINKS |
| ISR_1_BIT_3 | RX_LTE_SPIF_COMMON_SEL_LTE_ISR_ |
| REAL bit 3 | 2_V0: 0, 1, 2, 3, 4, 5, 6, 7, 8 |
| Consolidation 4 | UP LINKS |
| CHIP_SPIF_ | CHIP_SPIF_SEL_CHIP_STATUS: 0 |
| SEL_CHIP_ | DOWN LINKS |
| ISR_1_BIT_4 | RX_LTE_SPIF_COMMON_SEL_LTE_ISR_ |
| REAL bit 4 | 3: 0, 1, 2, 3, 8 |
| Consolidation 5 | UP LINKS |
| CHIP_SPIF_ | CHIP_SPIF_SEL_CHIP_STATUS: 0 |
| SEL_CHIP_ | DOWN LINKS |
| ISR_1_BIT_5 | RX_LTE_SPIF_COMMON_SEL_LTE ISR_ |
| REAL bit 5 | 3_V0: 0, 1, 2, 3, 4, 5, 6, 7, 8 |
| Consolidation 6 | UP LINKS |
| CHIP_SPIF_ | CHIP_SPIF_SEL_CHIP_STATUS: 0 |
| SEL_CHIP_ | DOWN LINKS |
| ISR_1_BIT_6 | RX_LTE_SPIF_COMMON_SEL_LTE_ISR_ |
| REAL bit 6 | 4: 0, 1, 2, 3, 8 |
| Consolidation 7 | UP LINKS |
| CHIP_SPIF_ | CHIP_SPIF_SEL_CHIP_STATUS: 0 |
| SEL_CHIP_ | DOWN LINKS |
| ISR_1_BIT_7 | RX_LTE_SPIF_COMMON_SEL_LTE_ISR_ |
| REAL bit 7 | 4_V0: 0, 1, 2, 3, 4, 5, 6, 7, 8 |
| Consolidation 8 | UP LINKS |
| CHIP_SPIF_ | CHIP_SPIF_SEL_CHIP_STATUS: 0 |
| SEL_CHIP_ | DOWN LINKS |
| ISR_1_BIT_8 | TX_LTE_SPIF_COMMON_SEL_LTE_ISR_ |
| REAL bit 8 | 1: 0, 1, 2, 3, 8, 14, 15, 16 |
| Consolidation 9 | UP LINKS |
| CHIP_SPIF_ | CHIP_SPIF_SEL_CHIP_STATUS: 0 |
| SEL_CHIP_ | DOWN LINKS |
| ISR_1_BIT_9 | TX_LTE_SPIF_COMMON_SEL_LTE_ISR_ |
| REAL bit 9 | 1_V0: 0, 1, 2, 3, 4, 5, 6, 7, 8, 9, 10, 11 |
| Consolidation 10 | UP LINKS |
| CHIP_SPIF_ | CHIP_SPIF_SEL_CHIP_STATUS: 0 |
| SEL_CHIP_ | DOWN LINKS |
| ISR_1_BIT_10 | RX_MEGA_POH_SEL_STS192_CH_ISR: |
| REAL bit 10 | 0, 1, 2, 3, 4, 5, 6, 7, 8, 9, 10, 11 |
| Consolidation 11 | UP LINKS |
| CHIP_SPIF_ | CHIP_SPIF_SEL_CHIP_STATUS: 0 |
| SEL_CHIP_ | DOWN LINKS |
| ISR_1_BIT_11 | RX_MEGA_POH_SEL_STS192_CH_ISR_ |
| REAL bit 11 | V0: 0, 1, 2, 3 |
| Consolidation 12 | UP LINKS |
| CHIP_SPIF_ | CHIP_SPIF_SEL_CHIP_STATUS: 0 |
| SEL_CHIP_ | DOWN LINKS |
| ISR_1_BIT_12 | TX_MEGA_POH_SEL_STS192_CH_ISR: |
| REAL bit 12 | 0, 1, 2, 3, 4, 5, 6, 7, 8, 9, 10, 11 |
| Consolidation 13 | UP LINKS |
| CHIP_SPIF_ | CHIP_SPIF_SEL_CHIP_STATUS: 0 |
| SEL_CHIP_ | DOWN LINKS |
| ISR_1_BIT_13 | TX_MEGA_POH_SEL_STS192_CH_ISR_ |
| REAL bit 13 | V0: 0, 1, 2, 3 |
| Consolidation 14 | UP LINKS |

TABLE 4-continued

HTML Traversable Tree Representation:
CHIP_SPIF_SEL_CHIP_ISR_1, Address = 0x0, Mask = 0xffff

| Bit position<br>Bit name | Direction<br>Register name: contributing bit 1, contributing bit N |
|---|---|
| CHIP_SPIF_SEL_CHIP_ISR_1_BIT_14<br>REAL bit 14<br>Consolidation 15 | CHIP_SPIF_SEL_CHIP_STATUS: 0<br>DOWN LINKS<br>EQPT_COMMON_SEL_EQPT_ISR: 0, 1, 2, 3, 4<br>UP LINKS |
| CHIP_SPIF_SEL_CHIP_ISR_1_BIT_15<br>REAL bit 15 | CHIP_SPIF_SEL_CHIP_STATUS: 0<br>DOWN LINKS<br>EQPT_COMMON_SEL_EQPT_ISR_V1: 0, 1, 2, 3 |

TABLE 5

HTML Traversable Tree Representation:
CHIP_SPIF_SEL_CHIP_ISR_2, Address = 0x2, Mask = 0x7fff

| Bit position<br>Bit name | Direction<br>Register name: contributing bit 1, contributing bit N |
|---|---|
| Consolidation 0<br>CHIP_SPIF_SEL_CHIP_ISR_2_BIT_0<br>REAL bit 0 | UP LINKS<br>CHIP_SPIF_SEL_CHIP_STATUS: 1<br>DOWN LINKS<br>CHIP_SPIF_SEL_R_CLK_LOSS_ALARM:<br>0, 1, 2, 3, 4, 5, 6, 7,<br>8, 9, 10, 11, 12, 13, 14,<br>15 |
| Consolidation 1<br>CHIP_SPIF_SEL_CHIP_ISR_2_BIT_1<br>REAL bit 1 | UP LINKS<br>CHIP_SPIF_SEL_CHIP_STATUS: 1<br>DOWN LINKS<br>CHIP_SPIF_SEL_T_CLK_LOSS_ALARM:<br>0, 1, 2, 3, 4, 5, 6, 7,<br>8, 9, 10, 11, 12, 13, 14,<br>15 |
| Consolidation 2<br>CHIP_SPIF_SEL_CHIP_ISR_2_BIT_2<br>REAL bit 2 | UP LINKS<br>CHIP_SPIF_SEL_CHIP_STATUS: 1<br>DOWN LINKS<br>CHIP_SPIF_SEL_S_CLK_LOSS_ALARM:<br>0, 1, 2, 3, 4, 5, 6, 7,<br>8, 9 |
| Consolidation 3<br>CHIP_SPIF_SEL_CHIP_ISR_2_BIT_3<br>REAL bit 3 | UP LINKS<br>CHIP_SPIF_SEL_CHIP_STATUS: 1<br>DOWN LINKS<br>CHIP_SPIF_SEL_OH_CLK_LOSS_ALARM:<br>0, 1, 2, 3, 4, 5, 6, 7 |
| Consolidation 4<br>CHIP_SPIF_SEL_CHIP_ISR_2_BIT_4<br>REAL bit 4 | UP LINKS<br>CHIP_SPIF_SEL_CHIP_STATUS: 1<br>DOWN LINKS<br>CHIP_SPIF_SEL_S_CLK_LOSS_ALARM_V0: 0 |
| Consolidation 5<br>CHIP_SPIF_SEL_CHIP_ISR_2_BIT_5<br>REAL bit 5 | UP LINKS<br>CHIP_SPIF_SEL_CHIP_STATUS: 1<br>DOWN LINKS<br>RX_MEGA_SWITCH_SEL_TSI_SLICE12_SUMRY_INT: 0, 1, 2, 3, 4,<br>5, 6, 7, 8, 9, 10, 11, 12,<br>13, 14, 15 |
| Consolidation 6<br>CHIP_SPIF_SEL_CHIP_ISR_2_BIT_6<br>REAL bit 6 | UP LINKS<br>CHIP_SPIF_SEL_CHIP_STATUS: 1<br>DOWN LINKS<br>TX_MEGA_SWITCH_SEL_TSI_SLICE12_SUMRY_INT: 0, 1, 2, 3, 4,<br>5, 6, 7, 8, 9, 10, 11, 12,<br>13, 14, 15 |
| Consolidation 7<br>CHIP_SPIF_SEL_CHIP_ISR_2_BIT_7<br>REAL bit 7 | UP LINKS<br>CHIP_SPIF_SEL_CHIP_STATUS: 1<br>DOWN LINKS<br>EQPT_COMMON_SEL_EQPT_ISR_V0: 0,<br>1, 2, 3, 4, 5, 6, 7 |
| Consolidation 8<br>CHIP_SPIF_SEL_CHIP_ISR_2_BIT_8<br>REAL bit 8 | UP LINKS<br>CHIP_SPIF_SEL_CHIP_STATUS: 1<br>DOWN LINKS<br>CHIP_SPIF_SEL_TIMED_INT: 0 |

TABLE 5-continued

HTML Traversable Tree Representation:
CHIP_SPIF_SEL_CHIP_ISR_2, Address = 0x2, Mask = 0x7fff

| Bit position<br>Bit name | Direction<br>Register name: contributing bit 1, contributing bit N |
|---|---|
| Consolidation 9<br>CHIP_SPIF_SEL_CHIP_ISR_2_BIT_9<br>REAL bit 9 | UP LINKS<br>CHIP_SPIF_SEL_CHIP_STATUS: 1<br>DOWN LINKS<br>LTE_RX_TRANS_SEL_4_TRANS_MEM_ISR: 0 |
| Consolidation 10<br>CHIP_SPIF_SEL_CHIP_ISR_2_BIT_10 REAL bit 10 | UP LINKS<br>CHIP_SPIF_SEL_CHIP_STATUS: 1<br>DOWN LINKS<br>LTE_TX_TRANS_SEL_4_TRANS_MEM_ISR: 0 |
| Consolidation 11<br>CHIP_SPIF_SEL_CHIP_ISR_2_BIT_11 REAL bit 11 | UP LINKS<br>CHIP_SPIF_SEL_CHIP_STATUS: 1<br>DOWN LINKS<br>RX_SERDES_SPIF_SEL_HCCRX_ISR: 0, 1, 2, 3, 4, 5, 6, 7, 8, 9, 10, 11, 12, 13, 14, 15, 16, 17 |
| Consolidation 12<br>CHIP_SPIF_SEL_CHIP_ISR_2_BIT_12 REAL bit 12 | UP LINKS<br>CHIP_SPIF_SEL_CHIP_STATUS: 1<br>DOWN LINKS<br>TX_SERDES_SPIF_SEL_HCCTX_ISR: 0, 1, 2 |
| Consolidation 13<br>CHIP_SPIF_SEL_CHIP_ISR_2_BIT_13 REAL bit 13 | UP LINKS<br>CHIP_SPIF_SEL_CHIP_STATUS: 1<br>DOWN LINKS<br>CHIP_SPIF_SEL_TMUX_RESYNC: 0, 1, 2, 3, 4, 5, 6, 7, 8, 9, 10, 11, 12, 13, 14, 15 |
| Consolidation 14<br>CHIP_SPIF_SEL_CHIP_ISR_2_BIT_14 REAL bit 14 | UP LINKS<br>CHIP_SPIF_SEL_CHIP_STATUS: 1<br>DOWN LINKS<br>CHIP_SPIF_SEL_S_TMUX_RESYNC: 0, 1, 2, 3, 4, 5, 6, 7, 8, 9, 10, 11, 12, 13, 14, 15 |
| Consolidation 15<br>CHIP_SPIF_SEL_CHIP_ISR_2_BIT_10_V0 REAL bit 10 | UP LINKS<br>CHIP_SPIF_SEL_CHIP_STATUS: 1<br>DOWN LINKS<br>LTE_TX_TRANS_SEL_3_TRANS_MEM_ISR: 0 |
| Consolidation 16<br>CHIP_SPIF_SEL_CHIP_ISR_2_BIT_10_V1 REAL bit 10 | UP LINKS<br>CHIP_SPIF_SEL_CHIP_STATUS: 1<br>DOWN LINKS<br>LTE_TX_TRANS_SEL_2_TRANS_MEM_ISR: 0 |
| Consolidation 17<br>CHIP_SPIF_SEL_CHIP_ISR_2_BIT_10_V2 REAL bit 10 | UP LINKS<br>CHIP_SPIF_SEL_CHIP_STATUS: 1<br>DOWN LINKS<br>LTE_TX_TRANS_SEL_1_TRANS_MEM_ISR: 0 |
| Consolidation 18<br>CHIP_SPIF_SEL_CHIP_ISR_2_BIT_13_V3 REAL bit 13 | UP LINKS<br>CHIP_SPIF_SEL_CHIP_STATUS: 1<br>DOWN LINKS<br>CHIP_SPIF_SEL_RDMX_RESYNC: 0, 1, 2, 3, 4, 5, 6, 7, 8, 9, 10, 11, 12, 13, 14, 15 |
| Consolidation 19<br>CHIP_SPIF_SEL_CHIP_ISR_2_BIT_13_V4 REAL bit 13 | UP LINKS<br>CHIP_SPIF_SEL_CHIP_STATUS: 1<br>DOWN LINKS<br>CHIP_SPIF_SEL_RMUX_TDMX_RESYNC: 0, 1, 2, 3, 4, 5, 6, 7 |
| Consolidation 20<br>CHIP_SPIF_SEL_CHIP_ISR_2_BIT_14_V5 REAL bit 14 | UP LINKS<br>CHIP_SPIF_SEL_CHIP_STATUS: 1<br>DOWN LINKS<br>CHIP_SPIF_SEL_S_RMUX_TDMX_RESYNC: 0, 1, 2, 3, 4, 5, 6, 7 |
| Consolidation 21<br>CHIP_SPIF_SEL_CHIP_ISR_2_BIT_14_V6 REAL bit 14 | UP LINKS<br>CHIP_SPIF_SEL_CHIP_STATUS: 1<br>DOWN LINKS<br>CHIP_SPIF_SEL_S_RDMX_RESYNC: 0, |

TABLE 5-continued

HTML Traversable Tree Representation:
CHIP_SPIF_SEL_CHIP_ISR_2, Address = 0x2, Mask = 0x7fff

| Bit position<br>Bit name | Direction<br>Register name: contributing bit 1, contributing bit N |
|---|---|
| | 1, 2, 3, 4, 5, 6, 7, 8,<br>9, 10, 11, 12, 13, 14,<br>15 |
| Consolidation 22<br>CHIP_SPIF_SEL_CHIP_ISR_2_BIT_9_<br>V7 REAL bit 9 | UP LINKS<br>CHIP_SPIF_SEL_CHIP_STATUS: 1<br>DOWN LINKS<br>LTE_RX_TRANS_SEL_3_TRANS_MEM_I SR: 0 |
| Consolidation 23<br>CHIP_SPIF_SEL_CHIP_ISR_2_BIT_9_<br>V8 REAL bit 9 | UP LINKS<br>CHIP_SPIF_SEL_CHIP_STATUS: 1<br>DOWN LINKS<br>LTE_RX_TRANS_SEL_2_TRANS_MEM_I SR: 0 |
| Consolidation 24<br>CHIP_SPIF_SEL_CHIP_ISR_2_BIT_9_<br>V9 REAL bit 9 | UP LINKS<br>CHIP_SPIF_SEL_CHIP_STATUS: 1<br>DOWN LINKS<br>LTE_RX_TRANS_SEL_1_TRANS_MEM_I SR: 0 |

TABLE 6

HTML Traversable Tree Representation:
CHIP_SPIF_SEL_CHIP_STATUS,
Address = 0x14, Mask = 0x7fff

| Bit position<br>Bit name | Direction<br>Register name: contributing bit 1, contributing bit N |
|---|---|
| Consolidation 0<br>CHIP_SPIF_SEL_CHIP_<br>STATUS_BIT_0 REAL<br>bit 0 | DOWN LINKS<br>CHIP_SPIF_SEL_CHIP_ISR_1: 0, 1,<br>2, 3, 4, 5, 6, 7, 8, 9,<br>10, 11, 12, 13, 14, 15, |
| Consolidation 1<br>CHIP_SPIF_SEL_CHIP_<br>STATUS_BIT_0_V0<br>REAL bit 0 | DOWN LINKS<br>CHIP_SPIF_SEL_CHIP_ISR_2: 0, 1,<br>2, 3, 4, 5, 6, 7, 8, 9,<br>10, 11, 12, 13, 14, 15,<br>16, 17, 18, 19, 20, 21, 22,<br>23, 24 |

FIG. 1 illustrates a CMS tool 150. The CMS tool 150 employs the static tree description 135 and/or the HTML traversable tree representation 145 to manage interrupts while the system of external devices is in operation. The condition management system 150 may operate in accordance with the U.S. patent application Ser. No. 10/612,097 entitled "A Condition Management System and Method of Operation Thereof," previously incorporated by reference. The hierarchical register consolidation structure contains a logical representation of the microprocessor-accessible registers, node interrelationships, summary bits and masks of the system of external devices and therefore relieves the CMS 150 of the task of conforming itself to the physical configuration of the registers, interrelationships, bits and masks.

In the illustrated embodiment of the present invention, the graph generator 110, the graph converter 120 and the description generator 130 are embodied in sequences of instructions executable in a general purpose computing system. Of course, the graph generator 110, the graph converter 120 and the description generator 130 could be implemented in hardware, firmware or any suitable combination of hardware, firmware or software.

Figure 2:
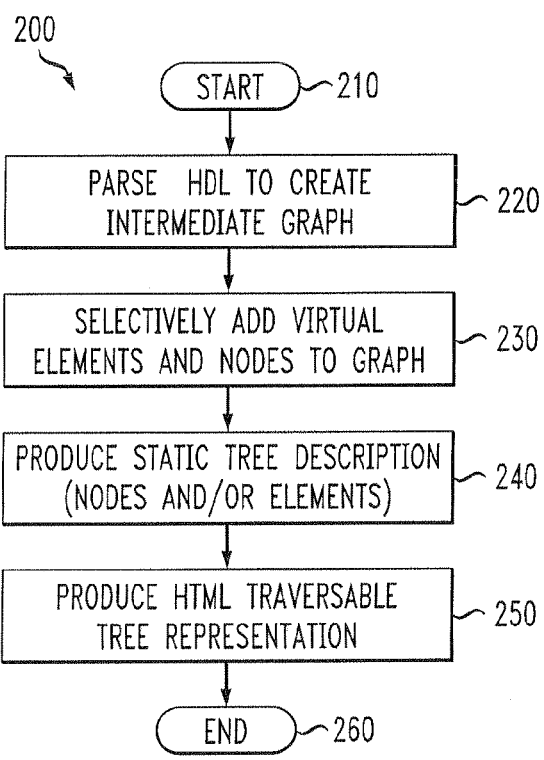
FIG. 2 illustrates a flow diagram of a method of automatically generating a hierarchical register consolidation structure carried out according to the principles of the present invention.

Turning now to FIG. 2, illustrated is a flow diagram of a method, generally designated 200, of automatically generating a hierarchical register consolidation structure carried out according to the principles of the present invention. The method 200 begins in a start step 210, wherein a HDL file is in existence, and it is desired to generate a hierarchical register consolidation structure from the HDL file.

The method 200 proceeds to a step 220 in which a HDL file is parsed to generate an intermediate graph containing definitions of microprocessor-accessible registers, node interrelationships and summary bits, bit offsets and masks associated with alarm registers. In the embodiment illustrated in FIG. 1, the parsing is done in three passes. First, definitions of all the microprocessor accessible registers, register names, addresses, bit positions used and their names are extracted. Second, node interrelationships are identified and alarm registers are associated with their mask register and persistency and delta information. Third, summary bits in an alarm register are associated with the alarm register that is summarized, and bit offsets and masks are generated.

Next, in a step 230, virtual elements and nodes are selectively added to the intermediate graph to transform the intermediate graph into a mathematical tree. Modification and/or pruning of the graph may be required to make it a true mathematical tree or desired to make it smaller or more efficient.

Then, in a step 240, the mathematical tree is employed to generate a static tree description in a programming language suitable for use by a device-independent condition management structure (C, in the illustrated embodiment). As has been demonstrated above, the static tree description can contain both node and element descriptions. Next, in a step 250, the static tree description is employed to generate an HTML traversable tree representation based on the mathematical tree. The method 200 then ends in an end step 260.

Although the present invention has been described in detail, those skilled in the art should understand that they can make various changes, substitutions and alterations herein without departing from the spirit and scope of the invention in its broadest form.

What is claimed is:

1. A system for automatically generating a hierarchical register consolidation structure, comprising:
   a processor;
   a graph generator that parses a Hardware Description High level Design Language (HDL) file in three different passes to generate an intermediate graph containing definitions of microprocessor-accessible registers, node interrelationships and summary bits, bit offsets and masks associated with alarm registers of external devices identified by said HDL file, wherein:
      a first pass extracts information associated with said microprocessor-accessible registers;
      a second pass identifies said node interrelationships and associates said alarm registers with mask registers and persistency and delta information; and
      a third pass generates said bit offsets and said masks associated with said alarm registers and associates said summary bits therewith;
   a graph converter, associated with said graph generator, that selectively adds virtual elements and nodes to said intermediate graph to transform said intermediate graph into a mathematical tree; and
   a description generator, associated with said graph converter, that employs said mathematical tree to generate a static tree description in a programming language suitable for use by a device-independent condition management structure and an HTML traversable tree representation based on said mathematical tree, wherein both of said static tree description and said HTML traversable tree representation form a hierarchical register consolidation structure to provide a logical representation of said microprocessor-accessible registers, node interrelationships, summary bits, bit offsets, and masks of said external devices.

2. The system as recited in claim 1 wherein said programming language is C.

3. The system as recited in claim 1 wherein said HDL file is produced by a hardware description tool.

4. The system as recited in claim 1 wherein said first pass extracts names, addresses, definitions, bit positions used and bit position names of said microprocessor-accessible registers.

5. The system as recited in claim 1 wherein said graph converter further removes multiple parent situations from said intermediate graph to transform said intermediate graph into said mathematical tree.

6. The system as recited in claim 1 wherein said condition management structure manages interrupts associated with said external devices employing said static tree or said HTML traversable tree.

7. The system as recited in claim 1 wherein said hierarchical register consolidation structure pertains to a real-time system.

8. A method of automatically generating a hierarchical register consolidation structure, comprising:
   parsing a Hardware Description High level Design Language (HDL) file in three passes to generate an intermediate graph containing definitions of microprocessor-accessible registers, node interrelationships and summary bits, bit offsets and masks associated with alarm registers of external devices identified by said HDL file, wherein:
      a first pass extracts information associated with said microprocessor-accessible registers;
      a second pass identifies said node interrelationships and associates said alarm registers with mask registers and persistency and delta information; and
      a third pass generates said bit offsets and said masks associated with said alarm registers and associates said summary bits therewith;
   selectively adding virtual elements and nodes to said intermediate graph to transform said intermediate graph into a mathematical tree; and
   employing said mathematical tree to generate a static tree description in a programming language suitable for use by a device-independent condition management structure and an HTML traversable tree representation based on said mathematical tree, wherein both of said static tree description and said HTML traversable tree representation form a hierarchical register consolidation structure to provide a logical representation of said microprocessor-accessible registers, node interrelationships, summary bits, bit offsets, and masks of said external devices.

9. The method as recited in claim 8 wherein said programming language is C.

10. The method as recited in claim 8 wherein said first pass extracts names, addresses, definitions, bit positions used and bit position names of said microprocessor-accessible registers.

11. The method as recited in claim 8 further comprising removing multiple parent situations from said intermediate graph to transform said intermediate graph into said mathematical tree.

12. The method as recited in claim 8 further comprising producing said HDL file with a hardware description tool.

13. The method as recited in claim 8 wherein said condition management structure interacts only with a logical representation of said microprocessor-accessible registers, node interrelationships, summary bits and masks and does not conform to a physical configuration thereof.

14. The method as recited in claim 8 further comprising pruning said intermediate graph to transform said intermediate graph into a mathematical tree.

* * * * *